United States Patent [19]

Usui

[11] 4,355,246
[45] Oct. 19, 1982

[54] TRANSISTOR-TRANSISTOR LOGIC CIRCUIT

[75] Inventor: Yuzo Usui, Kawasaki, Japan

[73] Assignee: Fujitsu Limited, Kanagawa, Japan

[21] Appl. No.: 967,635

[22] Filed: Dec. 8, 1978

[30] Foreign Application Priority Data

Dec. 9, 1977 [JP]  Japan ................................ 52-148617

[51] Int. Cl.³ .......................... H03K 3/26; H03K 3/01
[52] U.S. Cl. .................................... 307/456; 307/473; 307/270; 307/300
[58] Field of Search .......... 307/214, 209, 270, 300, 456, 307/473

[56] References Cited

U.S. PATENT DOCUMENTS

| | | | |
|---|---|---|---|
| 3,792,292 | 2/1974 | Priel | 304/209 |
| 4,037,115 | 7/1977 | Lee | 307/214 |
| 4,042,840 | 8/1977 | Chan | 307/209 |
| 4,131,808 | 12/1978 | Kuo | 307/214 |
| 4,194,132 | 3/1980 | Mrazek | 307/209 |

Primary Examiner—Larry N. Anagnos
Assistant Examiner—B. P. Davis
Attorney, Agent, or Firm—Staas & Halsey

[57] ABSTRACT

A delay element is introduced into a transistor-transistor logic circuit having a totem-pole-connected inverter transistor and an off-buffer transistor, in order to ensure a safe and correct operation even in the case where the transistor-transistor logic circuit is used as an element of multiple-connected transistor-transistor logic circuits.

14 Claims, 12 Drawing Figures

Fig. 6
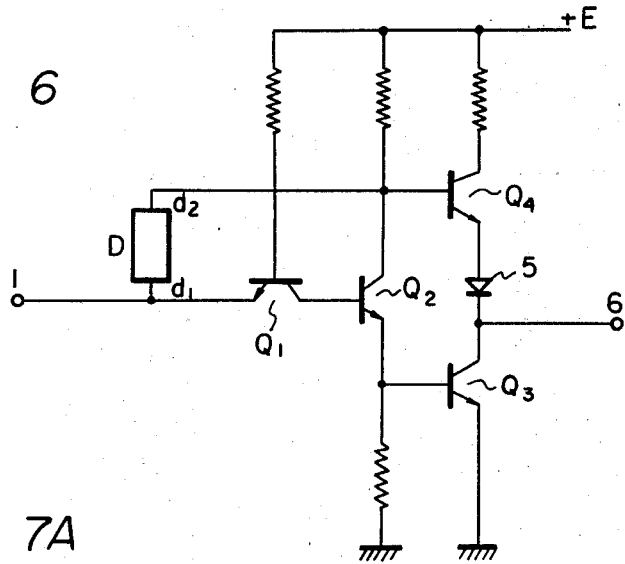
Fig. 7A
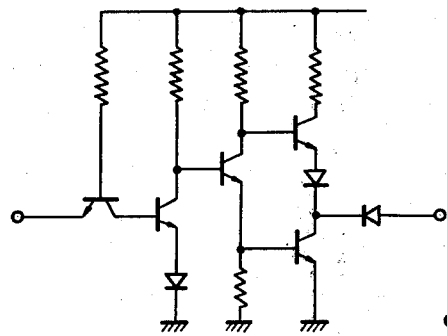
Fig. 7C
Fig. 7B
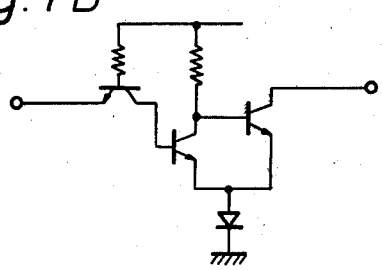

TRANSISTOR-TRANSISTOR LOGIC CIRCUIT

BACKGROUND OF THE INVENTION

1. Field of the Invention

The present invention relates to transistor-transistor logic circuits (TTL circuits), and particularly to multiple-connected TTL circuits in which a plurality of TTL circuits are connected at their output terminals and each of the TTL circuits is operated selectively.

2. Description of the Prior Art

Prior art TTL circuits comprising a totem-pole-connected inverter transistor and an off-buffer transistor have been used. Two examples of such prior art TTL circuits are respectively illustrated in FIG. 1 and FIG. 4. The operating characteristics of the circuits of FIG. 1 and FIG. 4 are shown in FIG. 2 and FIG. 5, respectively.

In FIG. 1, an output terminal 6 is provided at the connecting point of a totem-pole-connected inverter transistor $Q_3$ and an off-buffer transistor $Q_4$. The collector of the input transistor $Q_1$ is connected to the base of a phase-split transistor $Q_2$, the collector and the emitter of which are connected to the base of an off-buffer transistor $Q_4$ and the base of the inverter transistor $Q_3$, respectively.

The operating characteristics of the circuit shown in FIG. 1 are illustrated in FIG. 2. When the input 1 exhibits a LOW level, the transistor $Q_3$ is in an OFF state and the transistor $Q_4$ is in an ON state so that a HIGH level is thereby obtained at the output 6. On the contrary, when the input 1 exhibits a HIGH level, the transistor $Q_3$ is in an ON state and the transistor $Q_4$ is in an OFF state so that a LOW level is thereby obtained at the output 6. Thus, the circuit of FIG. 1 operates as an inverter. However, in the case where the circuit of FIG. 1 is used in a multiplex form in which the output terminal of the circuit of FIG. 1 is connected to the output terminal of another TTL circuit, a problem is caused in that, when both the off-buffer transistor $Q_4$ and the inverter transistor $Q_3'$ of another TTL circuit are in the ON state, the off-buffer transistor $Q_4$ and the inverter transistor $Q_3'$ of another TTL circuit are in danger of being damaged due to a strong current flowing through these two transistors, as indicated in FIG. 3.

In FIG. 4, the output terminal 6 is provided at the connecting point of the totem-pole-connected inverter transistor $Q_3$ and the off-buffer transistor $Q_4$. The collector of the input transistor $Q_1'$ having two emitters is connected to the base of the phase-split transistor $Q_2$, the collector and the emitter of which are connected to the base of the off-buffer transistor $Q_4$ and the base of the inverter transistor $Q_3$, respectively. One of the emitters of the input transistor $Q_1'$ is connected to a data input 1, and the other of the emitters of the input transistor $Q_1'$ is connected to a control input 2 through a buffer 3. The output of the buffer 3 is also connected to the base of the off-buffer transistor $Q_4$ connected to the collector of the phase-split transistor $Q_2$. The circuit shown in FIG. 4 is called a "tri-state" circuit or a "three-state" circuit.

The operating characteristics of the circuit of FIG. 4 are illustrated in FIG. 5. When the control input 2 exhibits a LOW level corresponding to the periods of $t_0$ to $t_1$ and $t_4$ to $t_7$, the phase-split transistor $Q_2$ is not supplied with a base current regardless of the level of the data input 1, thus, the phase-split transistor $Q_2$ is in an OFF state and, accordingly, the inverter transistor $Q_3$ is in an OFF state. The off-buffer transistor $Q_4$ is also in an OFF state since the diode 4 allows current conduction to occur, thus the potential of the connecting point of the collector of the transistor $Q_2$ and the base of the transistor $Q_4$ is caused to be maintained at a LOW level. Since both the inverter transistor $Q_3$ and the off-buffer transistor $Q_4$ are in the OFF state, the output 6 is in an OPEN state. This OPEN state is called "the third state".

When the control input 2 exhibits a HIGH level and the data input 1 exhibits a LOW level corresponding to the periods of $t_1$ to $t_2$ and $t_3$ to $t_4$, the phase-split transistor $Q_2$ is in an OFF state. Accordingly, the inverter transistor $Q_3$ is in an OFF state but the off-buffer transistor $Q_4$ is in an ON state. Since the off-buffer transistor $Q_4$ is in an ON state and the inverter transistor $Q_3$ is in an OFF state, the output 6 exhibits a HIGH level. This HIGH level state is called "the first state".

When both the control input 2 and the data input 1 exhibit a HIGH level corresponding to the period of $t_2$ to $t_3$, the phase-split transistor $Q_2$ is in an ON state. Accordingly, the inverter transistor $Q_3$ is in an ON state but the off-buffer transistor $Q_4$ is in an OFF state. Since the off-buffer transistor is in an OFF state and the inverter transistor is in an ON state, the output 6 exhibits a LOW level. This LOW level state is called "the second state".

In the case where a plurality of the type of TTL circuits of FIG. 4 are used and the output terminals of these TTL circuits are connected together to form a common output terminal, it does not occur that a large current is flowing through the series circuit of the inverter transistor $Q_3$ and the off-buffer transistor $Q_4$ as in the case of FIG. 1, since an off-buffer transistor, which can be in the ON state, of a TTL circuit is never connected to an inverter transistor $Q_3$ in the ON state, as a result of keeping the TTL circuits which are not being used in the above-mentioned OPEN state (the third state). However, in the above-described case it is not always certain that a control input signal is supplied to only one TTL circuit, although the control input signal of a HIGH level should be supplied to only one TTL circuit. If the control signal is supplied once in an incorrect manner, a strong current will flow through the off-buffer transistor $Q_4$ and the inverter transistor $Q_3$, and thus, the off-buffer transistor $Q_4$ and the inverter transistor $Q_3$ will be in danger of being damaged due to the strong current flowing therethrough. Furthermore, the probability of an occurrence of the above-described incorrect supply of a control signal increases in accordance with the increase in the number of connected TTL circuits.

These prior art TTL circuits are disclosed in, for example, the Japanese publication "Electronics Digest" issue of October, 1971, on pages 2 and 3. The present invention was created to overcome the above-described problems of the prior art TTL circuits of FIG. 1 and FIG. 4.

SUMMARY OF THE INVENTION

One of the objects of the present invention is to prevent the occurrence of an overcurrent in the transistors of TTL circuits comprising a totem-pole-connected inverter transistor and the off-buffer transistor wherein the output terminals of the TTL circuits are connected together to form a common output terminal.

Another object of the present invention is to dispense with the use of a control input as a signal input in addition to the data input and, accordingly, to prevent incorrect operations caused by the use of the control input.

BRIEF DESCRIPTION OF THE DRAWINGS

FIG. 1 shows an example of the prior art TTL circuits, and FIG. 2 shows the operating characteristics of the circuit of FIG. 1. FIG. 3 illustrates the over-current condition when plural prior art TTL circuits are commonly connected to their outputs. FIG. 4 shows another example of the prior art TTL circuits, and FIG. 5 shows the operating characteristics of the circuit of FIG. 4.

FIG. 6 through FIG. 10 illustrate embodiments of the present invention. FIG. 6 shows an embodiment of the TTL circuit according to the present invention. FIG. 7A, FIG. 7B and FIG. 7C show the examples of the delay circuit used in the circuit of FIG. 6. FIG. 7 shows the operating characteristics of the circuit of FIG. 6. FIG. 9 shows another embodiment of the TTL circuit according to the present invention.

DETAILED DESCRIPTION OF THE PREFERRED EMBODIMENTS

A TTL circuit which is an embodiment of the present invention is shown in FIG. 6. The output terminal 6 is provided at the connection point of the totem-pole-connected inverter transistor $Q_3$ and the off-buffer transistor $Q_4$. The collector of the input transistor $Q_1$ of the input stage circuit is connected to the base of the phase-split transistor $Q_2$, the collector and the emitter of which are connected to the base of the off-buffer transistor $Q_4$ and the base of the inverter transistor $Q_3$, respectively. As an important technical feature of the present invention, a delay element D is connected between the input terminal 1 and the collector of the phase-split transistor $Q_2$.

Examples of the structure of the delay element of the present invention are shown in FIG. 7A, FIG. 7B and FIG. 7C. In FIG. 6A, a buffer circuit which consists of four transistor stages and which has a diode in the output side is shown. In FIG. 7B, a buffer circuit which consists of three transistor stages and which has no diode in the output side is shown. In FIG. 7C, a buffer circuit which consists of two transistor stages and which has a diode in the output side is shown.

Figure 5:
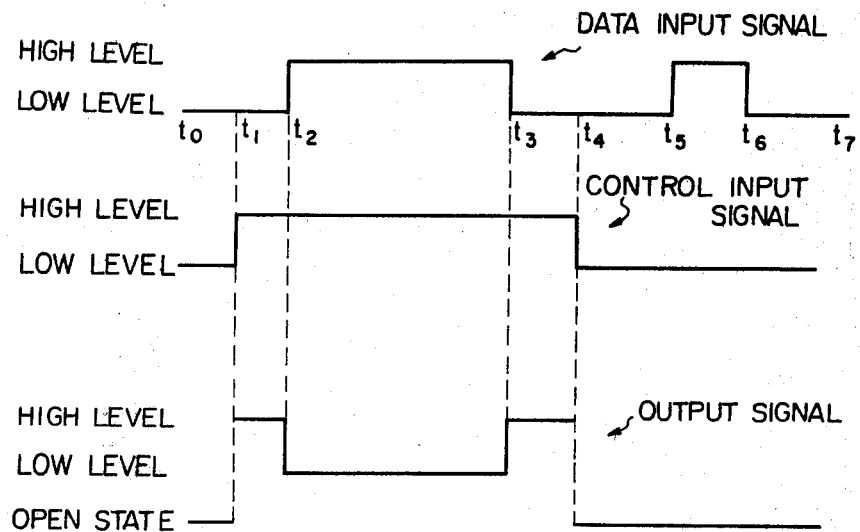
Figure 8:
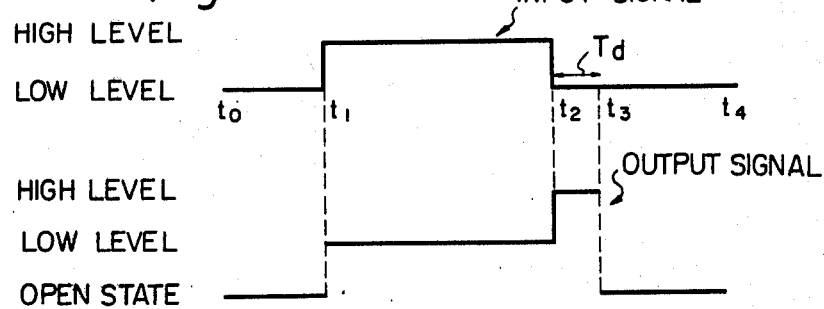

The operating characteristics of the circuit of FIG. 5 will now be explained with reference to FIG. 8. When the input 1 exhibits a LOW level corresponding to the period of $t_0$ to $t_1$, the phase-split transistor $Q_2$ is in an OFF state. Accordingly, the inverter transistor $Q_3$ is in an OFF state. The off-buffer transistor $Q_4$ is also in an OFF state because the output $d_2$ of the delay element D exhibits a LOW level. Since both the inverter transistor $Q_3$ and the off-buffer transistor $Q_4$ are in the OFF state, the output 6 is in an OPEN state.

Assume that the level of input 1 changes from LOW to HIGH at the time $t_1$ and is kept at the HIGH level during the period of $t_1$ to $t_2$. The phase-split transistor $Q_2$ is caused to be in the ON state. Accordingly, the inverter transistor $Q_3$ is caused to be in the ON state but the off-buffer transistor $Q_4$ is kept in the OFF state, because the level of the base of the off-buffer transistor is maintained at a LOW level. Since the off-buffer transistor $Q_4$ is in an OFF state and the inverter transistor is in an ON state, the output 6 exhibits a LOW level.

In the next step, assume that the level of input 1 changes from HIGH to LOW at the time $t_2$ and is kept at the LOW level during the period of $t_2$ to $t_4$. The phrase-split transistor $Q_2$ is caused to be in the OFF state, and the inverter transistor $Q_3$ is thereby caused to be in the OFF state. The off-buffer transistor $Q_4$ is caused to be in the ON state at the time $t_2$, since the potential at the output $d_2$ of the delay element D is kept at a HIGH level. However, the phase-split transistor $Q_2$ is caused to be in an OFF state. Thus, the output 6 exhibits a HIGH level at the time $t_2$, since the off-buffer transistor $Q_4$ is in the ON state and the inverter transistor $Q_3$ is in the OFF state. This HIGH level of the output 6 is maintained during the delay time $T_d$, corresponding to the time from $t_2$ to $t_3$, of the delay element. At the time $t_3$ after the period of delay time $T_d$, the level of the potential at the output $d_2$ of the delay element D is caused to be a LOW level due to the operation of the delay element D. Accordingly, the off-buffer transistor $Q_4$ is changed from the ON state to the OFF state. During the period from $t_3$ to $t_4$, the output 6 exhibits an OPEN state, since both the off-buffer transistor and the inverter transistor are in an OFF state.

Figure 9:
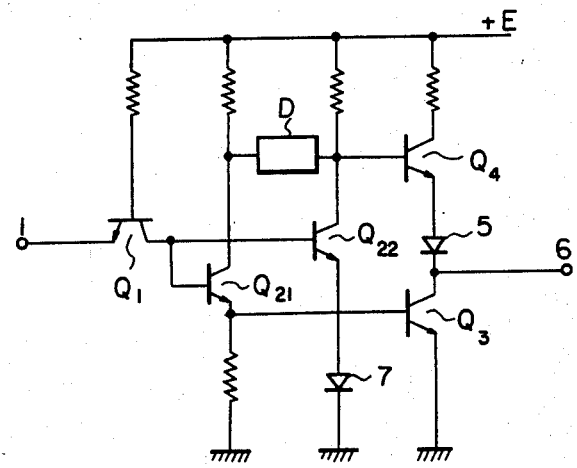
Figure 10A:
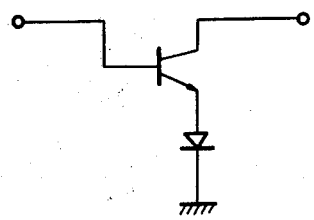
FIG. 10A and FIG. 10B show the examples of the delay circuit used in the circuit of FIG. 3.
Figure 10B:
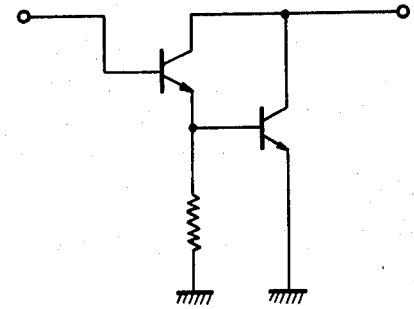

Another embodiment of the TTL circuit of the present invention is shown in FIG. 9. The differences between the circuit shown in FIG. 9 and the circuit shown in FIG. 6 reside in that, in the circuit of FIG. 9, the phase-split transistor consists of a first transistor $Q_{21}$ for controlling the inverter transistor $Q_3$ and a second transistor $Q_{22}$ for controlling the off-buffer transistor $Q_4$, and the delay element is connected between the collector of the first transistor $Q_{21}$ and the collector of the second transistor $Q_{22}$. The examples of the structure of the delay element are shown in FIG. 10A and FIG. 10B. In FIG. 10A, a circuit which consists of a single transistor stage is shown. In FIG. 10B, a circuit which comprises two transistor stages is shown. The operating characteristics of the circuit of FIG. 9 are the same as those explained hereinbefore with reference to FIG. 8. However, it should be noted that, in the circuit of FIG. 9, it is necessary that the delay element D should be provided with a signal polarity reversal characteristic, in order to effect the reversal of the polarity of the signal from the first transistor $Q_{21}$, since the reversal of the polarity of the signal is effected in the first transistor $Q_{21}$.

Figure 1:
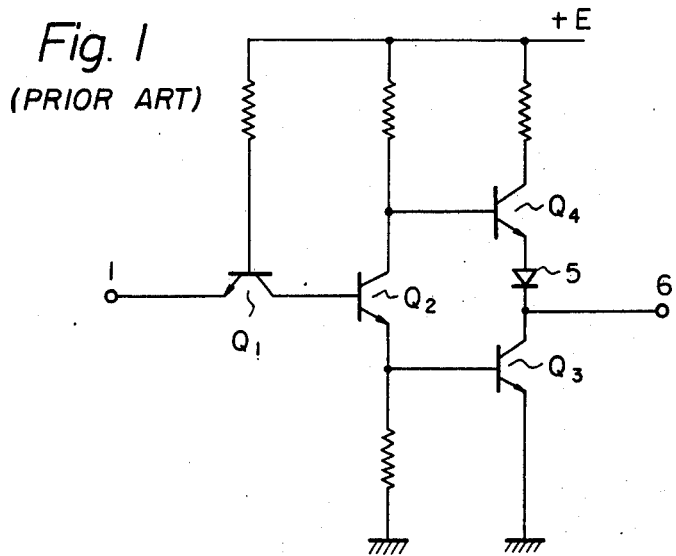
FIG. 1 through FIG. 5 illustrate the prior art TTL circuits.
Figure 2:
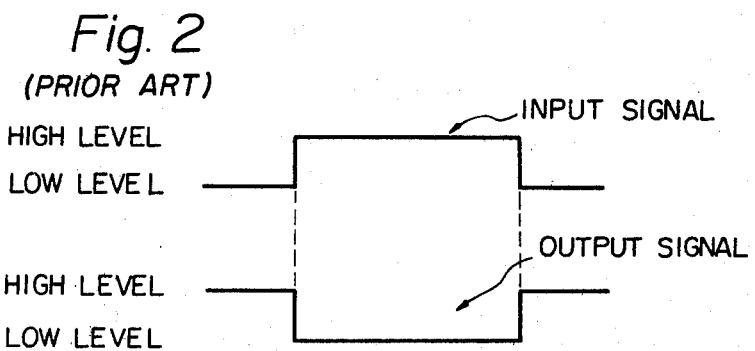
Figure 3:
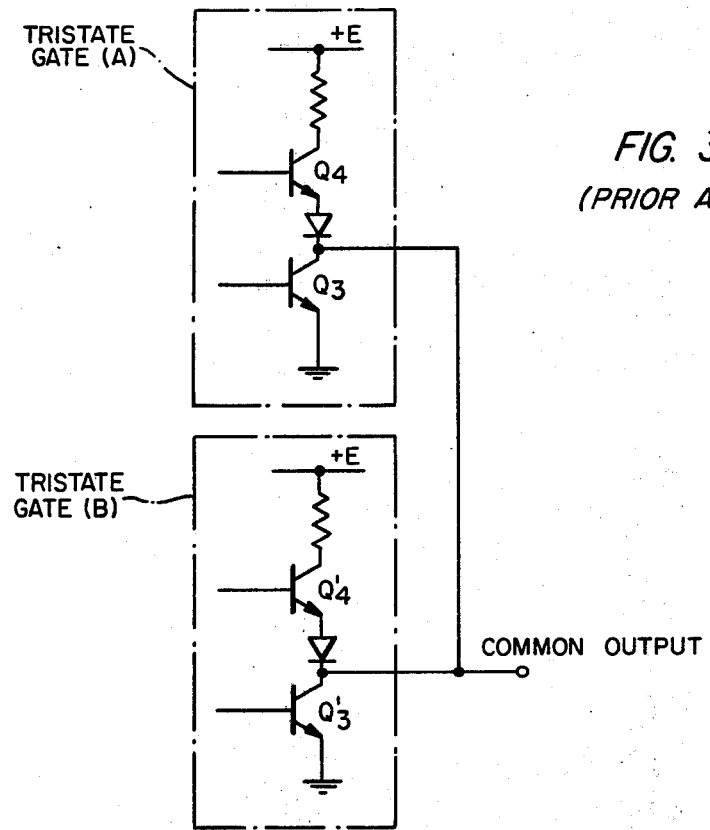
Figure 11:
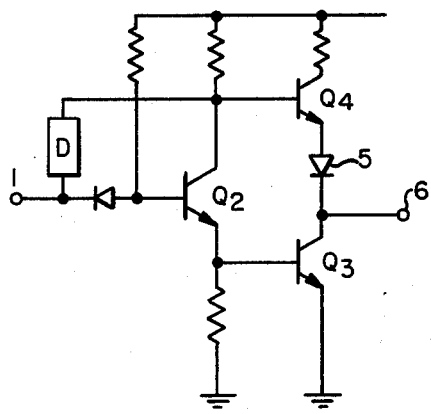
FIGS. 11 and 12 show alternate embodiments of the TTL circuit of the present invention.

In the above-described embodiments of the present invention, although the input stage circuit of the TTL circuit comprises the input transistor $Q_1$, it is also possible to replace the input transistor $Q_1$ with a diode circuit. Therefore, in the present specification, the term TTL circuit should be construed to include a TTL circuit whose input stage circuit comprises a diode which can carry out an operation equivalent to that of an input transistor, and an accompanying resistor, as shown in FIG. 11.

Figure 12:
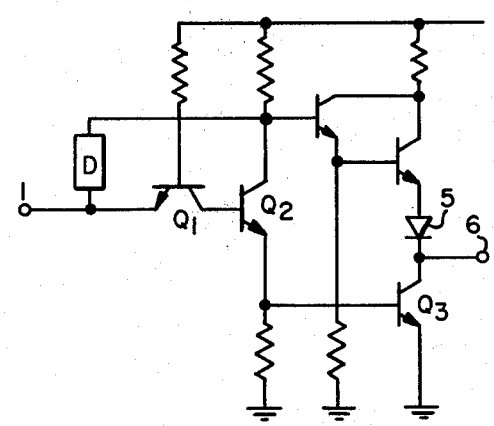
Figure 4:
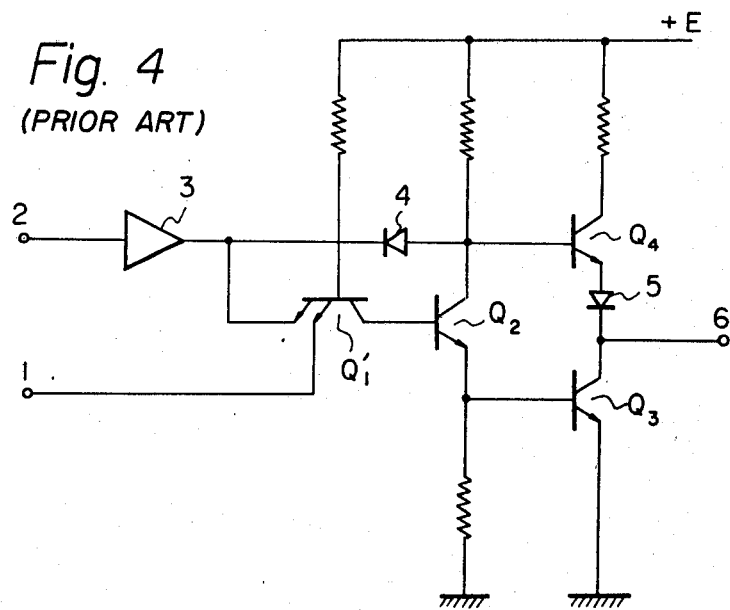

Furthermore, the off-buffer transistor may be substituted with the so-called Darlington connected two transistors, as shown in FIG. 12A.

What is claimed is:

1. A three-state transistor-transistor logic circuit that is operable without a control input, said logic circuit comprising:

an input stage for inputting a signal to said TTL circuit, a phase-split transistor stage connected to receive the output of said input stage, a totem-pole-connected circuit including an off-buffer transistor connected serially with an inverter transistor, the bases of said off-buffer and inverter transistors being connected to respective points of said phase-split transistor stage, a delay circuit having its output connected to the base of said off-buffer transistor and its input selectively connected to the input of said input stage or to a respective terminal of said phase-split transistor stage, said connection of said input and output of the delay circuit providing a low level output of said TTL circuit when the input to said TTL circuit is at a high level a high level output for a period equal to the delay time of said delay circuit, after said high level input returns to a low level input, and an open state output of the TTL circuit at other times, wherein said TTL circuit is operable without said control input to produce said three outputs.

2. The TTL circuit of claim 1
said phase-split transistor stage comprising a phase-split transistor having its emitter connected to the base of said inverter transistor and its collector connected to the base of said off-buffer transistor, and said delay circuit having its input connected to the input of said input stage for receiving said input signal to said TTL circuit.

3. The TTL circuit of claim 2, said delay circuit having the characteristic of transmitting a signal without polarity reversal.

4. The TTL circuit of claim 3, said delay circuit comprising four transistor stages and a diode connected between the output of the last of the four transistor stages and said output of the delay circuit.

5. The TTL circuit of claim 3, said delay circuit comprising three transistor stages, the output of the last of the three stages being connected directly to said output of the delay circuit.

6. The TTL circuit of claim 3, said delay circuit comprising two transistor stages and a diode connected between the output of the last of the two stages and said output of the delay circuit.

7. The TTL circuit of claim 1, said phase-split transistor stage comprising first and second transistors, said first transistor having its emitter connected to the base of said inverter transistor, its collector connected to said input of the delay circuit, and its base connected to the output of said input stage of the TTL circuit, and said second transistor having its collector connected to the base of the off-buffer transistor, and its base connected to the output of said input stage of the TTL circuit.

8. The TTL circuit of claim 7, said delay circuit having the characteristic of transmitting a signal with polarity reversal.

9. The TTL circuit of claim 8, said delay circuit consisting of a single transistor stage.

10. The TTL circuit of claim 8, said delay circuit comprising two transistor stages.

11. The TTL circuit of claim 8, said input stage consisting of an input transistor and a resistor for biasing the base of the input transistor.

12. The TTL circuit of claim 1, 3 or 8, said input stage consisting of a diode and a resistor connected to the output side of the diode.

13. The TTL circuit of claim 1, 3 or 8, comprising a diode connected between said off-buffer transistor and said inverter transistor.

14. The TTL circuit of claim 1, 3 or 8, said off-buffer transistor being replaced by a Darlington-connected pair of transistors.

* * * * *

UNITED STATES PATENT AND TRADEMARK OFFICE
CERTIFICATE OF CORRECTION

PATENT NO. : 4,355,246

DATED : 19 October 1982

INVENTOR(S) : Yuzo Usui

It is certified that error appears in the above-identified patent and that said Letters Patent is hereby corrected as shown below:

In the drawings:
Fig. 5, should be labelled "PRIOR ART".

Front Page, [73] Assignee: the prefecture "Kanagawa" should be the city --Kawasaki--.

Col. 3, line 11, "to" should be --at--;

line 15, change "10" to --10B--;

line 18, delete "the" (first occurrence);

line 19, "7" should be --8--;

line 24, "3" should be --9--;

line 44, "6" should be --7--.

Col. 4, line 6, "phrase" should be --phase--;

line 62, "12A" should be --12--.

Signed and Sealed this

Twelfth Day of April 1983

[SEAL]

Attest:

GERALD J. MOSSINGHOFF

Attesting Officer    Commissioner of Patents and Trademarks